(12) United States Patent
Takahashi et al.

(10) Patent No.: US 6,797,932 B2
(45) Date of Patent: Sep. 28, 2004

(54) CHARGE AMOUNT DETECTION CIRCUIT AND TWO-DIMENSIONAL IMAGE SENSOR USING SAME

(75) Inventors: Masayuki Takahashi, Tenri (JP); Hisao Okada, Ikoma-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/821,605

(22) Filed: Mar. 29, 2001

(65) Prior Publication Data

US 2003/0205660 A1 Nov. 6, 2003

(30) Foreign Application Priority Data

Mar. 30, 2000 (JP) ........................................ 2000-095508

(51) Int. Cl.[7] .......................... H01L 27/00; H01J 40/14; H04N 3/14; H04N 5/335
(52) U.S. Cl. ............................... 250/208.1; 250/214 A; 348/300
(58) Field of Search ..................... 250/208.1, 214 A, 250/214 LA, 214 LS, 214 DC, 208.4; 348/307, 308, 241, 300, 301

(56) References Cited

U.S. PATENT DOCUMENTS

| | | | | |
|---|---|---|---|---|
| 4,808,822 A | * | 2/1989 | Manning et al. | 250/208.1 |
| 5,332,893 A | * | 7/1994 | Potts et al. | 250/208.1 |
| 5,436,442 A | * | 7/1995 | Michon et al. | 250/208.1 |
| 6,459,078 B1 | * | 10/2002 | Fowler | 250/214 A |

FOREIGN PATENT DOCUMENTS

| | | | | |
|---|---|---|---|---|
| JP | 361070872 A | * | 4/1986 | .......... H04N/5/335 |
| JP | 2002-324401 | | 11/2000 | |
| TW | 231767 | | 10/1994 | |

OTHER PUBLICATIONS

Taiwan Office Action Translation of Notice of First Rejection, dated Mar. 15, 2002, pp 1–3.
*Dynamic X–Ray Imaging System Based on an Amorphous Silicon Thin–Film Array*, N. Jung, et al., SPIE vol. 3336 Feb. (1998) pp. 396–407.
*Development of a selenium–based flat–panel detector for real–time radiography and fluoroscopy*, Tsukamoto, et al., SPIE vol. 3336 Feb. (1998) pp. 388–395.
*Flat Panel imaging system for fluoroscopy applications*, Colbeth, et al., SPIE vol. 3336 Feb. (1998) pp. 376–387.

* cited by examiner

*Primary Examiner*—Georgia Epps
*Assistant Examiner*—Alicia Harrington
(74) *Attorney, Agent, or Firm*—David G. Conlin; Peter J. Manus; Edwards & Angell, LLP (57) ABSTRACT

In a charge amount detection circuit, one part of circuit elements constituting a low pass filter circuit and one part of circuit elements constituting a voltage amplifier circuit are commonly use. A charge sensitive amplifier is followed by the low pass filter circuit and the voltage amplifier circuit, respectively, in this order. Since the low pass filter circuit is provided so as to share one part of circuit elements of the voltage amplifier circuit, it is possible to suppress the enlargement of the chip size due to the provision of LPF as much as possible so as to suppress the rise of the chip cost as much as possible.

13 Claims, 13 Drawing Sheets

CHARGE AMOUNT DETECTION CIRCUIT AND TWO-DIMENSIONAL IMAGE SENSOR USING SAME

FIELD OF THE INVENTION

The present invention relates to a charge amount detection circuit for use in an image sensor such as an X-ray sensor such as using and relates to a two-dimensional image sensor using such a charge amount detection circuit.

BACKGROUND OF THE INVENTION

Figure 13:
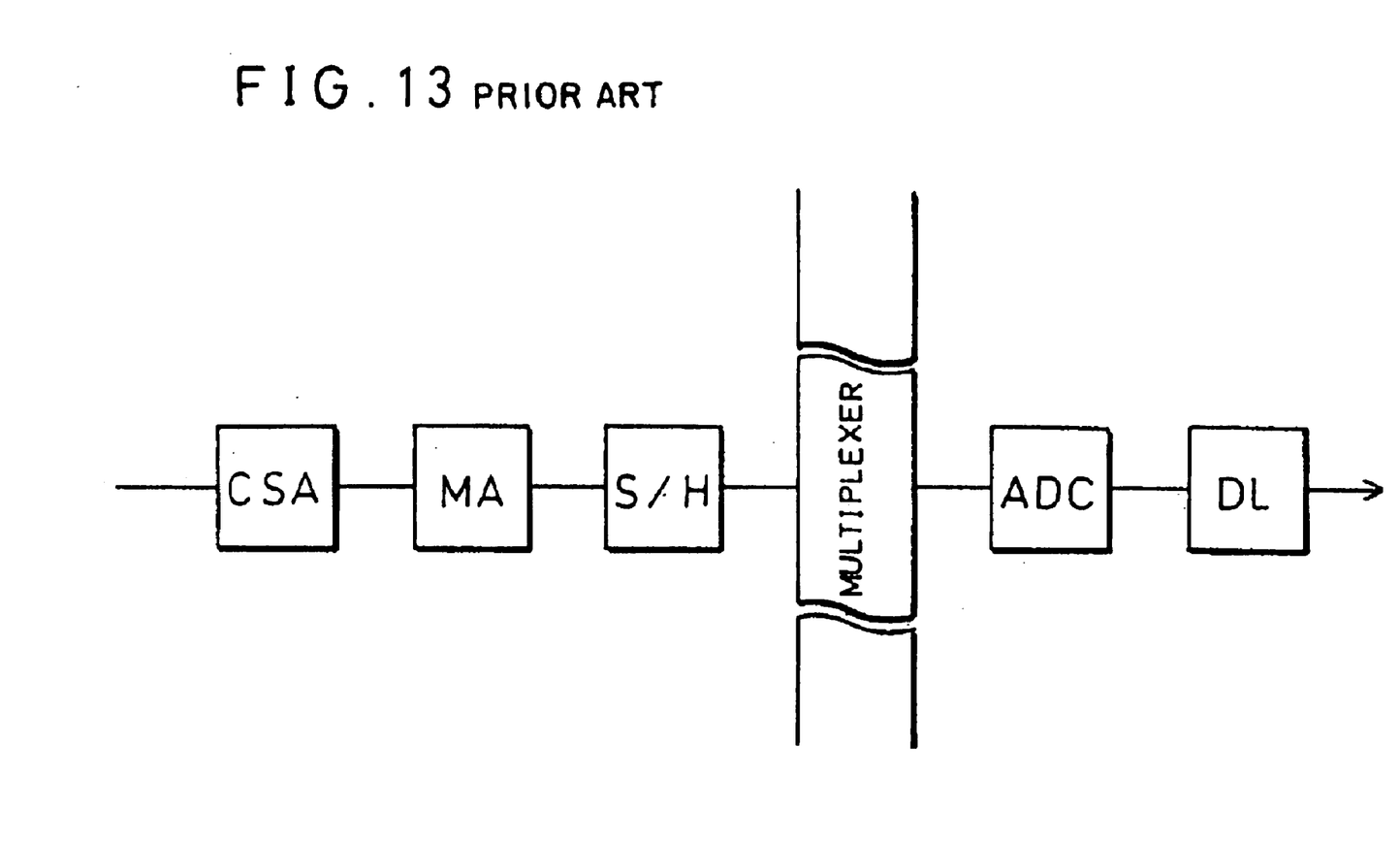
FIG. 13 is a block diagram showing a circuit configuration of a conventional unit reading circuit for a single input.

First, the following description deals with an image sensor having a general two-dimensional matrix structure with reference to FIGS. 1 through 9 that are diagrams for explaining the present invention and FIG. 13.

The image sensor can be used in an X-ray diagnosis apparatus when it is functioned as an X-ray sensor for detecting X-rays, for example.

Figure 1:
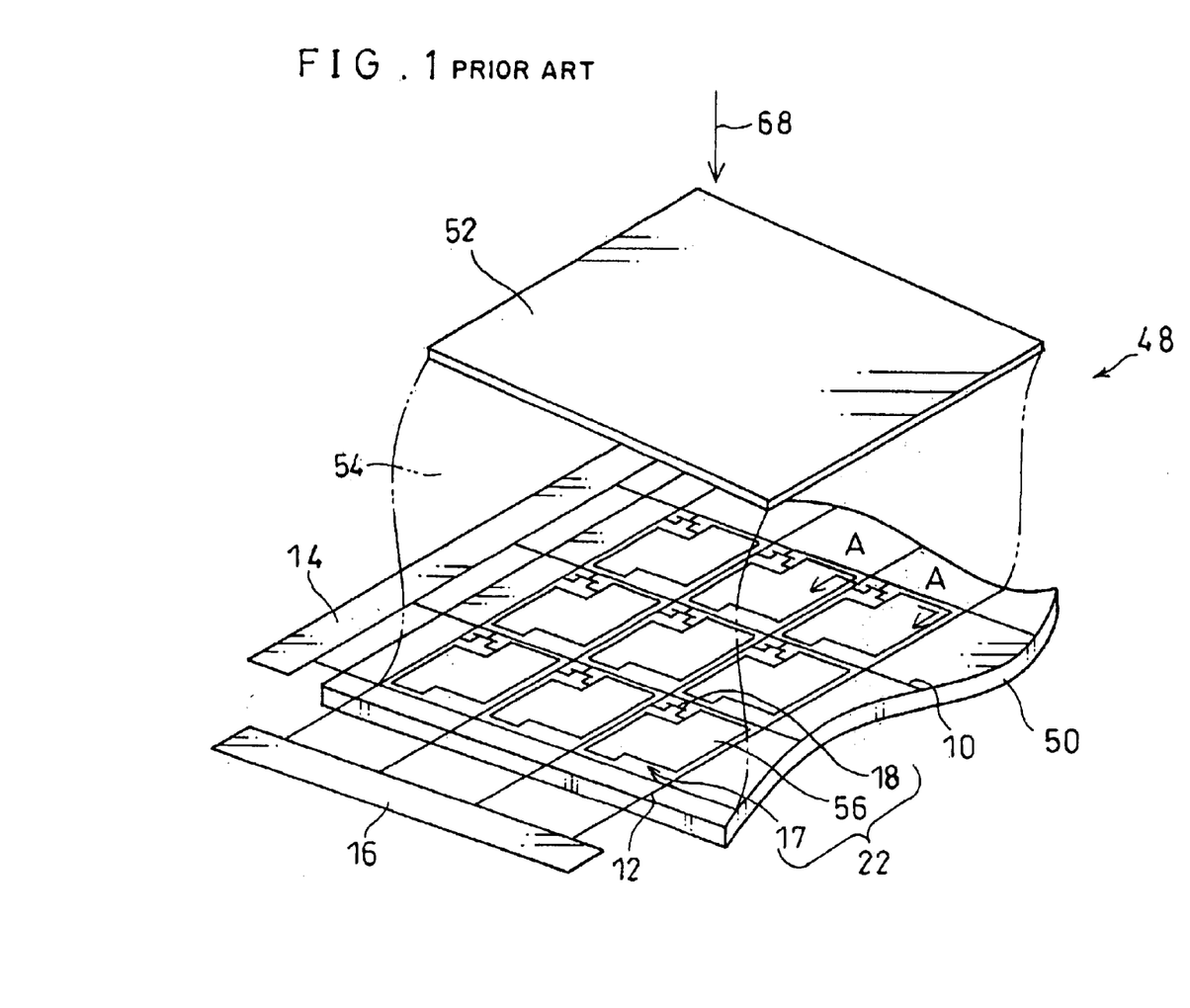
FIG. 1 is a perspective view showing a structure of an X-ray sensor having a charge amount detection circuit of the present invention.

In an image sensor 48 shown in FIG. 1, is provided with a photoelectric conversion layer 54 and a bias electrode 52 on a glass substrate 50. The photoelectric conversion layer 54 is formed by a thin film made of amorphous selenium or other materials. The bias electrode 52 is formed by a metal film that transmits the X-rays, for example a conductive layer such as gold. On the surface of the photoelectric conversion layer 54 side of the glass substrate 50, pixel electrodes 56 that are provided in a matrix manner, a storage capacitor (pixel capacitance) 17, switching devices 18, scanning lines 10 (column), and data lines 12 (row). The scanning lines 10 and the data lines 12 are connected with a scanning driver (gate driver) 14 and a reading circuit 16, respectively.

Thus, the image sensor 48 is mainly composed of a photoelectric conversion layer 54 and an accumulation capacitor 17, i.e., is composed of (a) a photoelectric section for converting photons such as X-rays into charges and storing the charges and (b) a reading circuit (charge amount detection circuit) 16 for reading a signal relating to the stored charges from the photoelectric section.

The pixel electrode 56 is connected with the data line 12 through the switching device 18. The switching operation of the switching device 18 is carried out in response to a voltage sent by the scanning driver 14 through the scanning line 10. In the case of a thin film transistor (hereinafter referred to as TFT) that is generally used as the switching device 18, a source of the TFT is connected with the pixel electrode 56, a drain of the TFT is connected with the data line 12, and a gate of the TFT is connected with the scanning line 10. In the following description, it is assumed that the TFT is used as the switching device 18.

Figure 2:
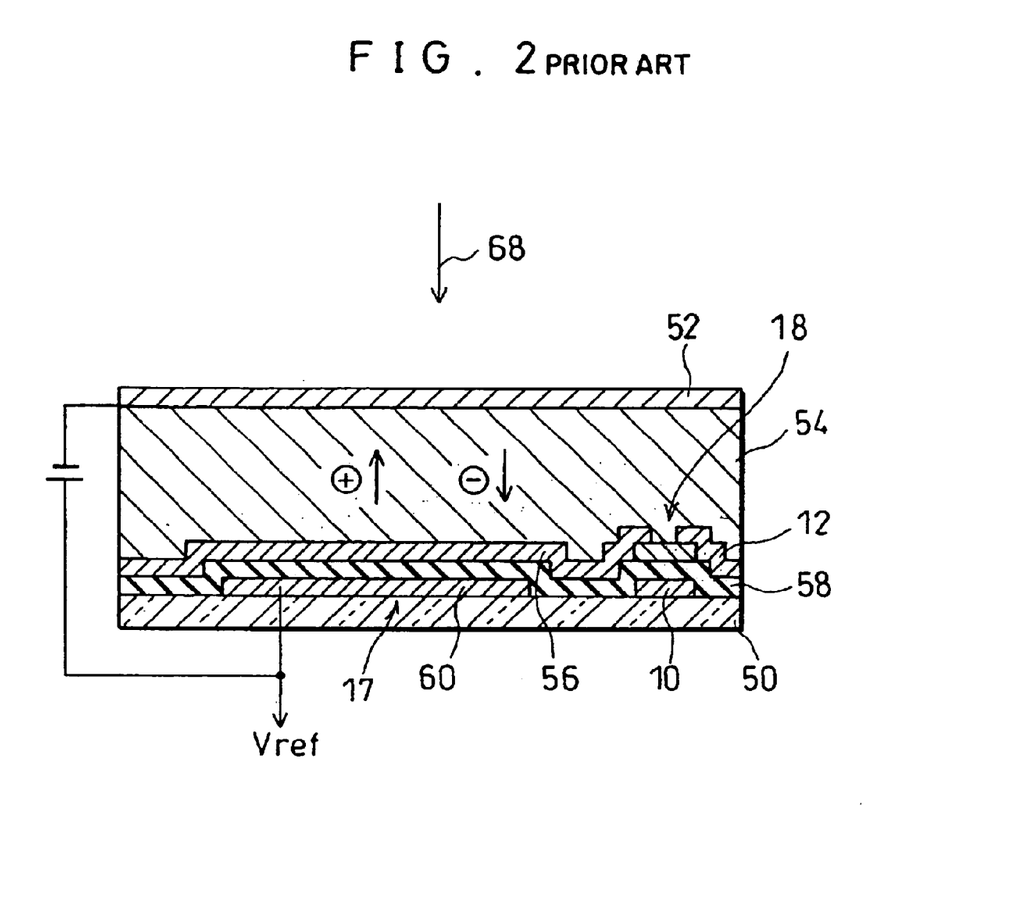
FIG. 2 is a cross-sectional view, showing the structure of the X-ray sensor, taken along line A—A of FIG. 1.

FIG. 2 is a cross-sectional view taken along line A—A in FIG. 1. An auxiliary electrode 60 is provided so as to face the pixel electrode 56 through an insulating film 58. The storage capacitor 17 is formed by the pixel electrode 56, the auxiliary electrode 60, and the insulating film 58 provided therebetween. The auxiliary electrode 60 is wired so that a common reference voltage (Vref) is applied to all pixel electrodes 22. The bias electrode 52 can apply a high voltage (for example, several thousands of voltages) to the pixel electrode 56.

When X-ray photons 68 are incident on the image sensor 48 from the bias electrode 52 side, the X-ray photons 68 that have transmitted the bias electrode 52 generates electron-hole pairs in the photoelectric conversion layer 54. In the case where a positive voltage is applied to the bias electrode 52 side, the holes move toward the pixel electrode 56 so as to arrive at the pixel electrode 56 located in a position corresponding to the position on which the photon 68 are incident. In the case where a negative voltage is applied to the bias electrode 52 side, the electrons move toward the pixel electrode 56 so as to arrive at the pixel electrode 56 located in a position corresponding to the position on which the photon 68 are incident. The holes or electrons that have arrived at the pixel electrode 56 are stored by the capacitor 17. The charges having positive polarity or negative polarity that have been stored by the capacitor 17 (hereinafter referred to as signal charges) are outputted to the data line 12 in response to the switching-on of the switching device 18 of TFT, and the charged amount (signal charge amount) is read out by the reading circuit 16 that is connected with the data lines 12.

When the scanning driver 14 outputs a voltage of a high level to a target scanning line 10, all the TFTs connecting with the scanning line 10 turn on. The signal charges stored by each capacitor 17 flows out to the corresponding data line 12. The scanning driver 14 consecutively outputs a voltage of a high level to the respective scanning lines 10, thereby resulting in that the data of all the pixel electrodes 56 are read out. Thus, the image data of one page are read out.

Figure 3:
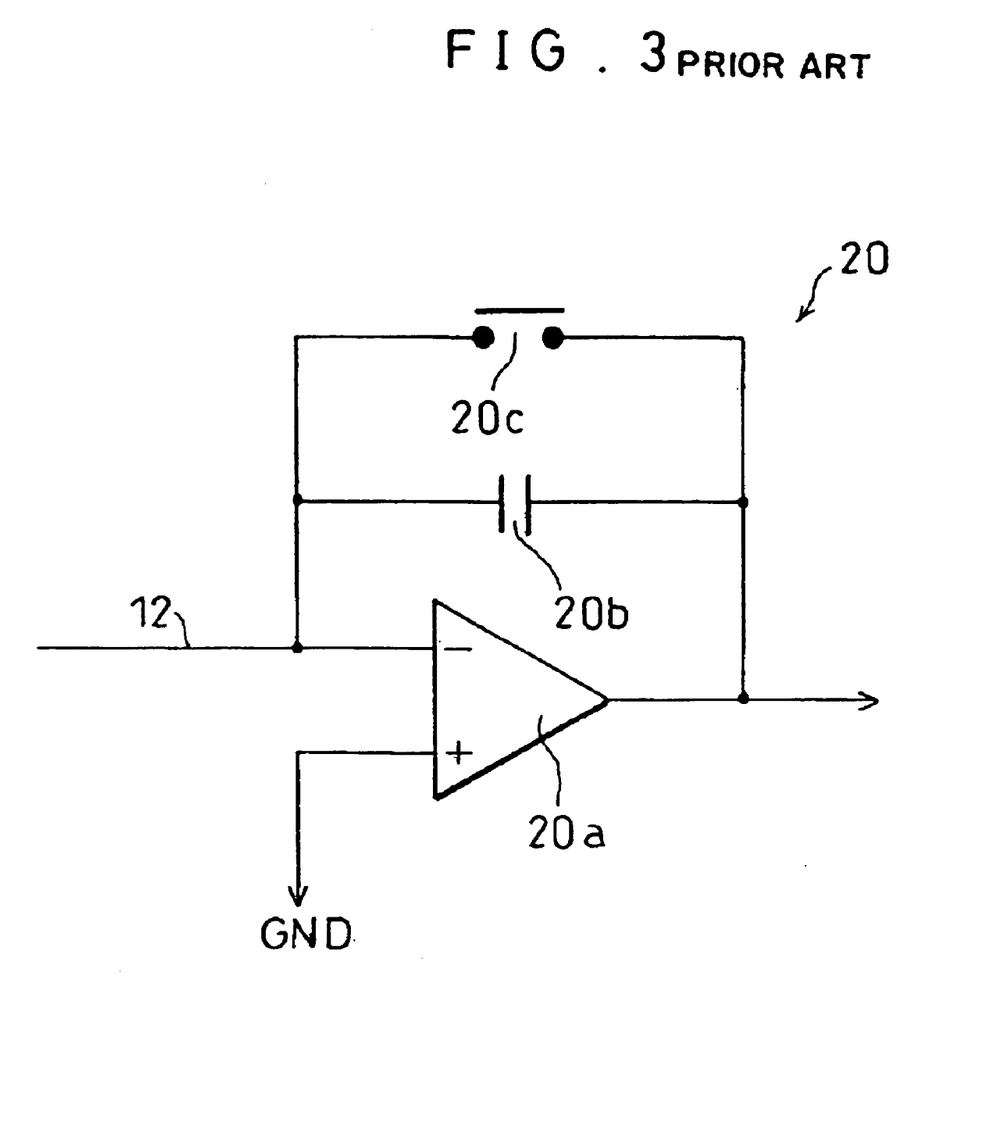
FIG. 3 is a circuit diagram showing a structure of a basic circuit of a charge sensitive amplifier.

The following description deals with the reading circuit 16 which is used in the image sensor 48. FIG. 3 is a circuit diagram showing a basic structure of a charge sensitive amplifier (hereinafter referred to as CSA) 20 used for reading out the charge amount. In an operational amplifier 20a, an inverted input terminal and an output terminal are connected with each other through a feedback capacitor 20b so as to form a negative feedback circuit. A reset switch 20c is connected in parallel with the feedback capacitor 20b so that the resetting is carried out by discharging the charges stored in the feedback capacitor 20b. The data line 12 is connected with the inverted input terminal of the operational amplifier 20a, and a non-inverted input terminal is connected with a reference voltage GND.

Figure 4:
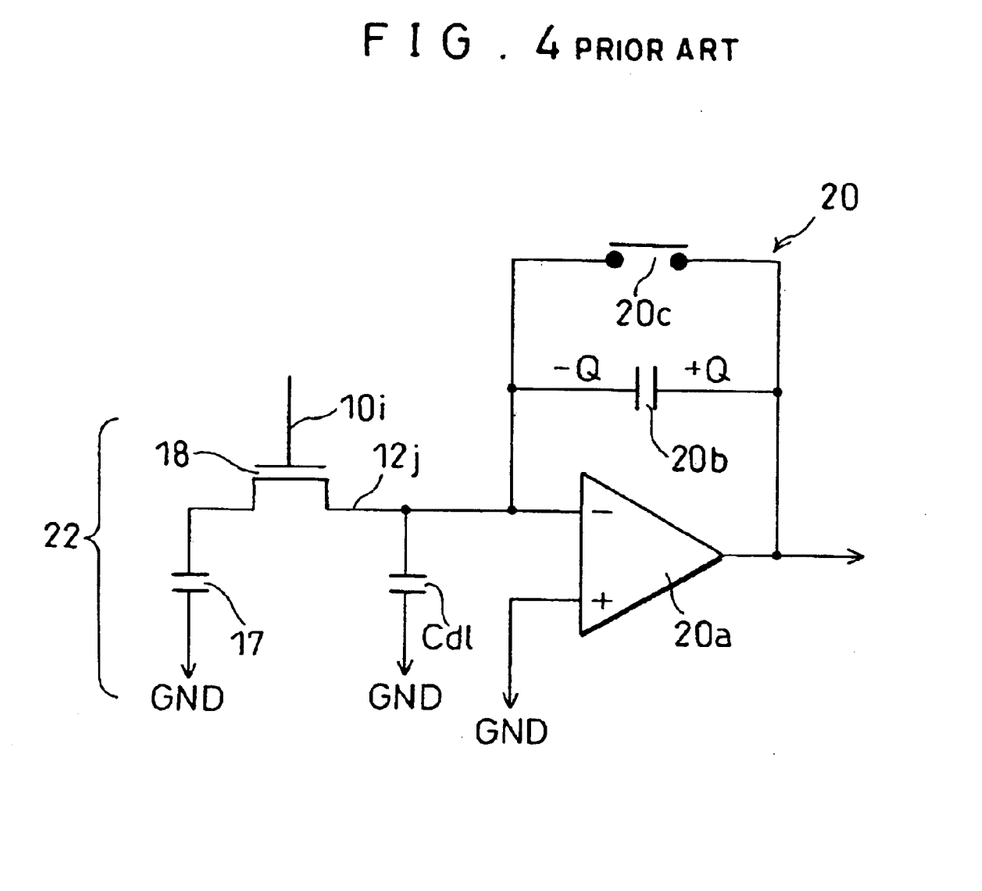
FIG. 4 is a circuit diagram showing an equivalent circuit of a pixel and a charge sensitive amplifier that corresponds to a single data line.
Figure 5:
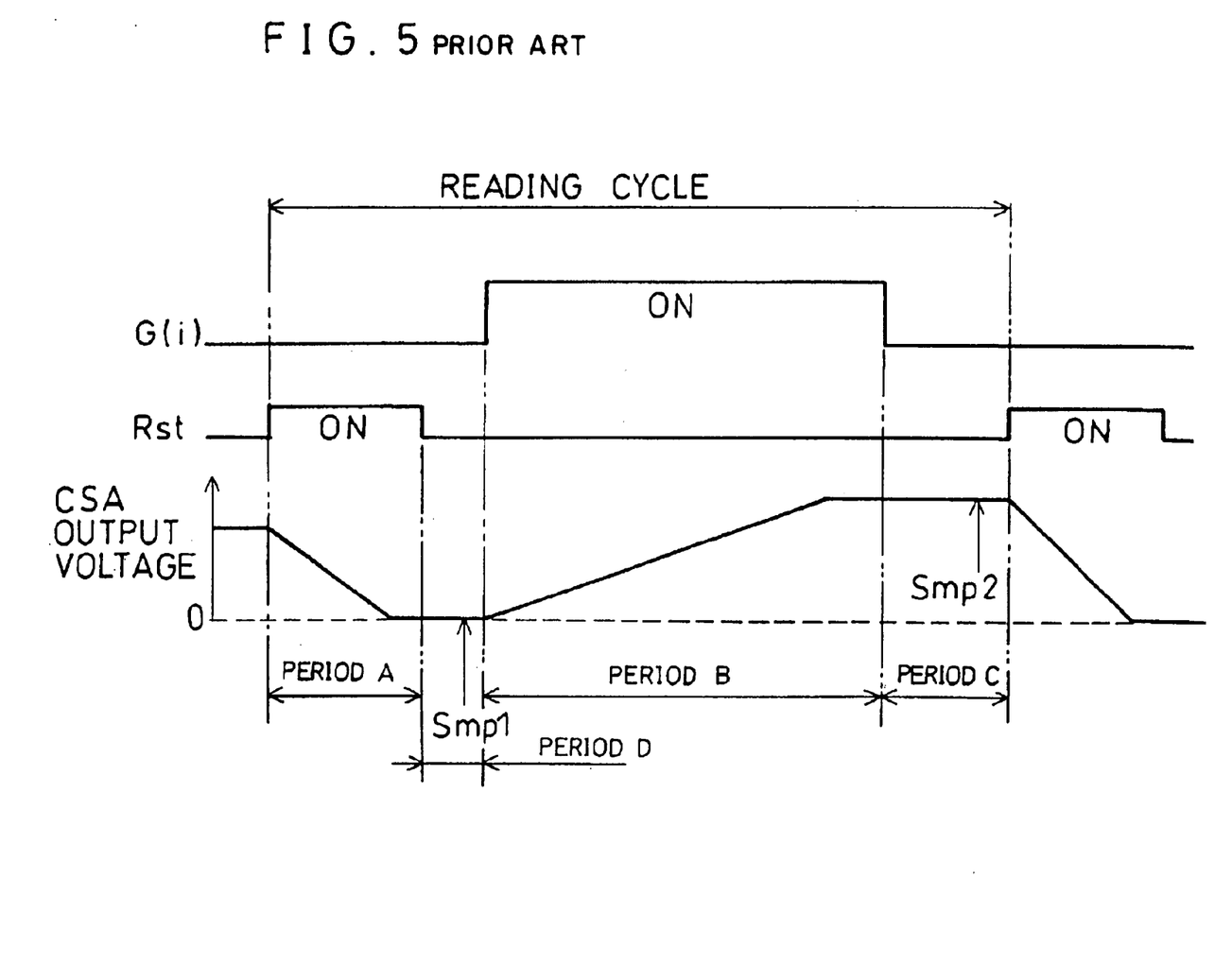
FIG. 5 is an explanatory view showing the operation for reading a signal charge.

FIG. 4 is an equivalent circuit for reading one pixel 22 including the switching devices 18 and the capacitor 17. FIG. 5 is a graph showing the timing for the reading operations and the output voltage of the CSA 20 in FIG. 4.

In FIG. 4, it is assumed that the pixel 22 indicates a pixel connected with a scanning line 10i and a data line 12j. The scanning line 10i corresponds to a scanning line 10 of the i-th column and the data line 12j corresponds to a data line 12 of the j-th row. Note that Cdl indicates a capacitance of the data line 12j. In FIG. 5, G(i) indicates a voltage outputted to the scanning line 10i, and Rst indicates a reset signal outputted to the reset switch 20c.

According to the reading operation, first, the reset switch 20c turns on (period A). This causes the charges that have been stored in the feedback capacitor 20b in the previous operation to be discharged so as to carry out the resetting. As a result, the output voltage of the CSA 20 reduces to the reference voltage GND, i.e., zero. Then, Rst becomes a voltage of a low level (period D), a voltage of a high level is outputted to G(i) so that the switching device 18 of TFT turns on. The signal charge (−Q) stored in the capacitor 17 flows out to the data line 12j. The operational amplifier 20a operates so that all the signal charge (−Q) that have flowed out to the data line 12j are collected to an electrode of the input side of the feedback capacitor 20b. Thus, the same amounts of charge (+Q) having negative polarity are come out on an electrode of the output side of the feedback capacitor 20b. Finally, the CSA 20 outputs a voltage obtained by dividing the charge Q that corresponds to the signal charge by the capacitance of the feedback capacitor 20b (period B). By reading such a voltage, it is possible to detect the signal charge as a voltage. After a little while is passed since a voltage of a low level is outputted to G(i) of this column (period C), the Rst is reset again for another reading operation of the next column, thereby resulting in that the output voltage of the CSA 20 returns to the reference voltage GND.

The following description briefly deals with a voltage reading method that is so called as a correlated double sampling (hereinafter referred to as CDS). If the circuit system shown in FIG. 4 is perfect, the voltage that has been read during the period C must correctly correspond to the signal charge amount. In actual, however, during the period D after the resetting, the output voltage of the CSA 20 is not perfectly equal to the reference voltage GND, thereby causing the generation of an offset voltage. Such an offset voltage is generated due to (a) an offset or a flicker noise of the operational amplifier 20a and/or (b) a feed through phenomenon occurred when the TFT (switching devices 18) and/or the reset switch 20c turn on and off. The field through phenomenon is essential to MOS switches. According to this phenomenon, the channel charges caught during the turning-on by (a) a capacitor formed by the gate and the source and (b) a capacitor formed by the gate and the drain are released in response to the decreasing of the gate voltage so as to flow out to the drain and the source.

The CDS reads out the voltage of the CSA 20 in accordance with the respective timings of smp1 and smp2 shown in FIG. 5. By finding the difference between the voltages read out in accordance with the respective timings smp1 and smp2, it is possible to find with accuracy the voltage fluctuation of the CSA 20 during the period between the timings smp1 and smp2. Thus, the CDS is carried out so that the offset occurred during period D is removed. This means that it is possible to deal with in the same manner as the case where the voltage is read out only once during period C in an ideal circuit system in which no offset is occurred during the period D. Note that since the CDS is not directly correlated to the present invention, the following description is dealt with for the convenience of explanation assuming that the reading out operation is carried out only once during the period C in an ideal circuit system that can be dealt with as equivalent by the CDS.

FIG. 13 is a circuit diagram showing a structure of a reading circuit (hereinafter referred to as a unit reading circuit) for a single input. According to the unit reading circuit, the signal charge is outputted as a digital data. The output of the CSA is amplified by a voltage amplifier circuit (main amplifier) MA and is sampled and held by a sampling hold circuit S/H. The voltage thus held is sent to an A/D (analog to digital) converter ADC through a multiplexer so as to be converted to a digital value, and is held by a data latch circuit DL. Note that the multiplexer is provided for assigning a plurality of input terminals to a single ADC and is not essential to the circuit. Accordingly, such a multiplexer is not necessary in the case where an ADC is arranged so as to correspond to each input terminal one to one.

The main amplifier MA is provided for fully amplifying the signal voltage to the range in which following circuits can appropriately operate when the output of the CSA is small.

The radiography apparatus is generally used in a static picture filming (filming mode). In this case, the amount of the X-rays to be projected is fully large. Since the signal charge amount is also so large that a fully large voltage is come out in the CSA, it is not always necessary to provide the main amplifier MA. In contrast, in the case where a dynamic picture is obtained (fluoroscopy mode), it is necessary to keep projecting the X-rays during a period of time between several seconds and several minutes. To suppress the total amount of the X-rays to be projected, X-rays which have two-order weaker intensity than that of the filming mode are used. Thus, the signal charge amount in the fluoroscopy mode is extremely little compared with the filming mode, thereby necessitating the provision of the main amplifier MA. Note that two-stage of main amplifier configuration is used in accordance with the required amplification though the main amplifier MA is indicated as a single block in FIG. 13.

Figure 6:
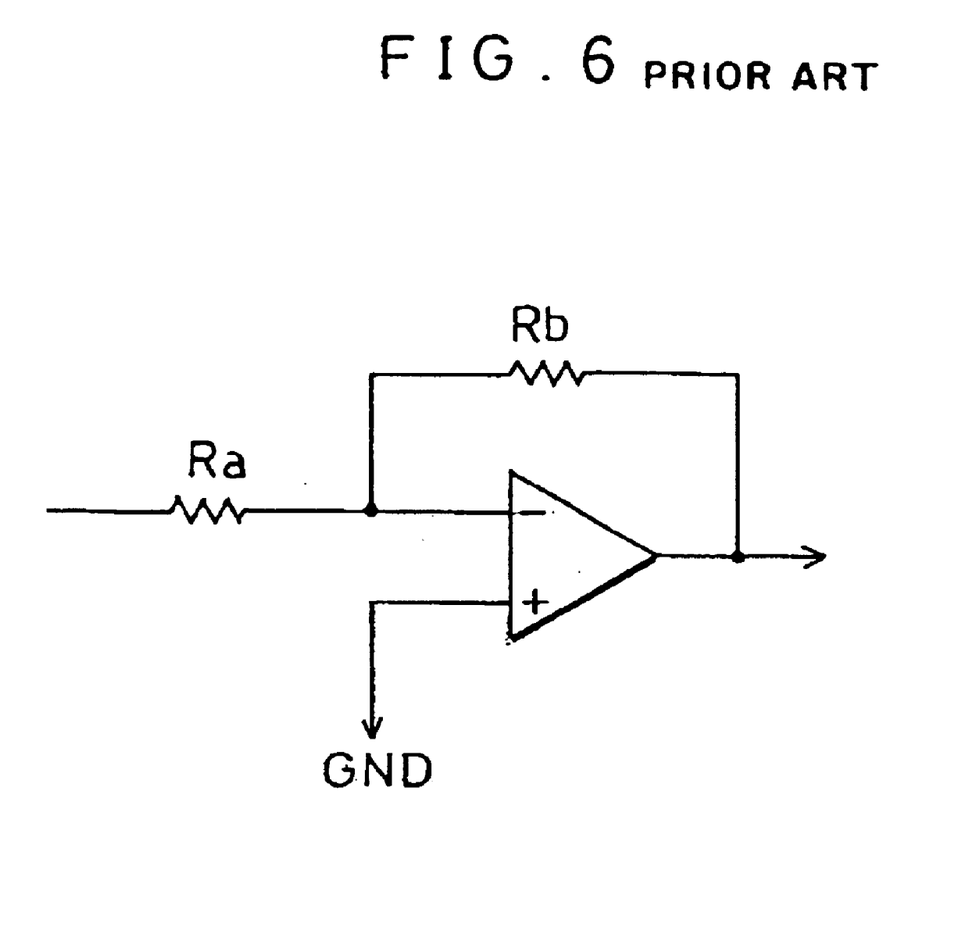
FIG. 6 is a circuit diagram showing a structure of a typical voltage amplifier circuit in which an operational amplifier is used.

FIG. 6 shows a typical example of the structure of the main amplifier MA. The example shown in FIG. 6 uses an inverted amplifier circuit realized by an operational amplifier. The amplification is determined in accordance with the ratio of Rb/Ra, Ra and Rb being indicative of registers, respectively.

Figure 7:
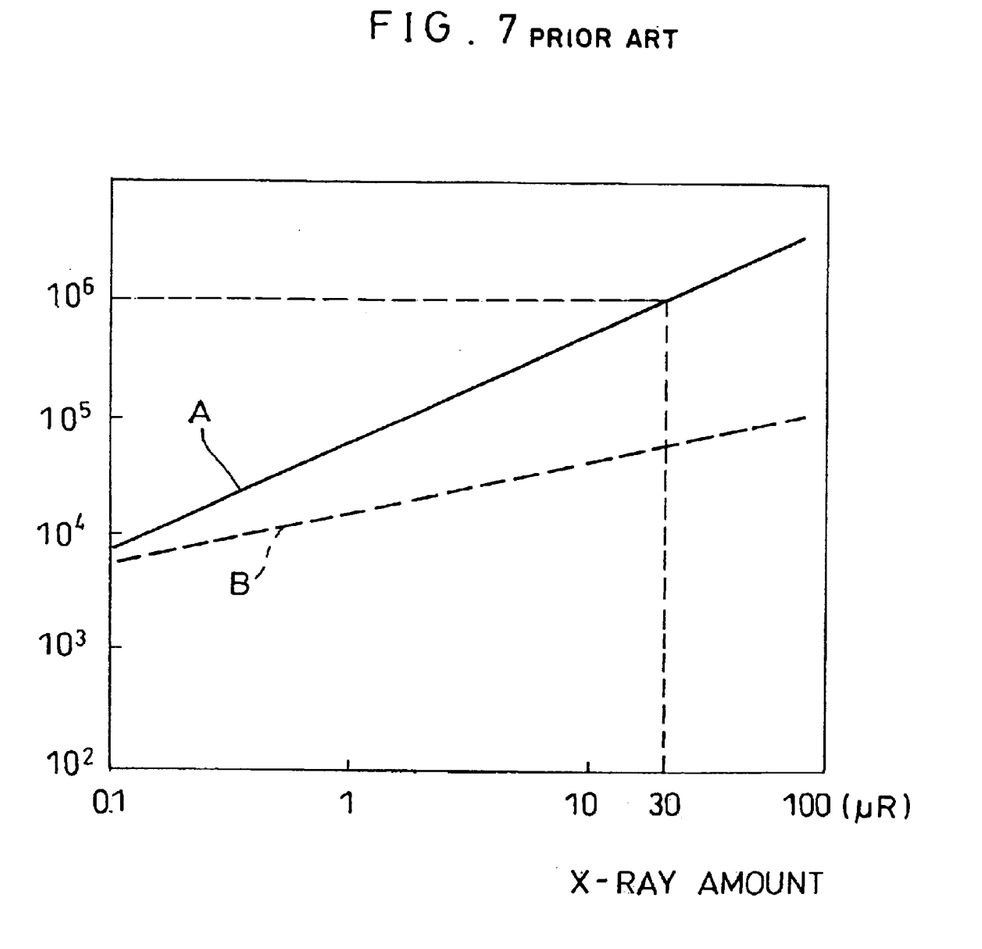
FIG. 7 is a graph showing one example of the conversion characteristics of an a-Se photoelectric conversion layer.
Figure 8:
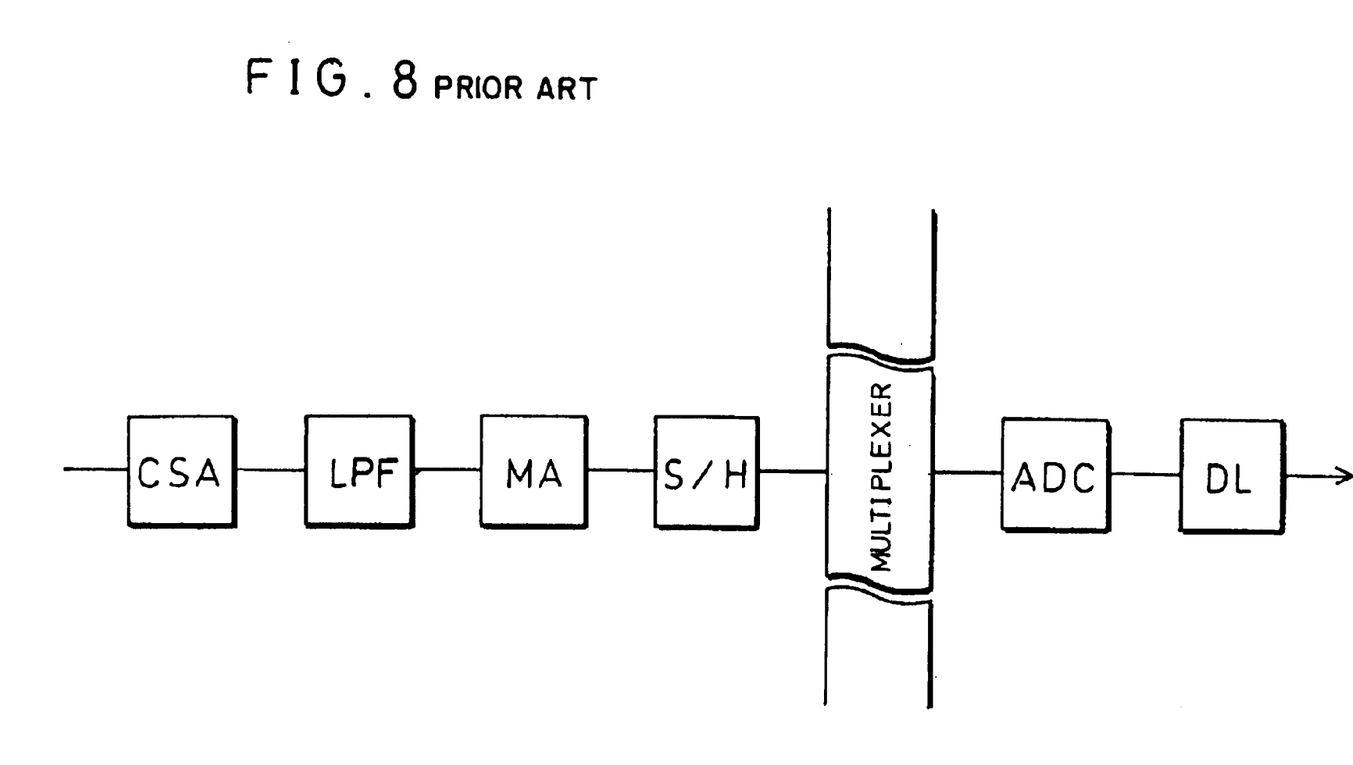
FIG. 8 is a block diagram showing a circuit configuration of a unit reading circuit for a single input in which a low pass filter is provided.

FIG. 7 shows one example of how the signal charge amount varies depending on the X-ray amount (X-ray intensity) of a-Se photoelectric conversion layer. Note that the absolute value of the vertical axis varies depending on the thickness of the photoelectric conversion layer, the bias voltage to be applied, and pixel size, respectively. Line A indicates the signal charge amount, and line B indicates the quantum noise. In this case, the signal charge amount of about 8,000 e-rms is generated for the X-ray amount of 0.1 $\mu$R, while the signal charge amount of about 1,000,000 e-rms is generated for the X-ray amount of 30 $\mu$R. Note that 1R (1 roentgen) indicates the projecting amount of the X-rays required for the generation of unit charge per 1 $cm^3$ air, and corresponds to $2.58 \times 10^{-4}$C/kg. Note also that "e-rms" indicates the number of electrons expressed by rms (root mean square). In other words, the expectation value of the number of electrons that will be generated (detected). Here, since 0.1 $\mu$R is the minimum dose in the fluoroscopy mode and 30 $\mu$R is the minimum dose in the filming mode, it is clear that the signal charge amount generated in the fluoroscopy mode is about 1/100 of the filming mode. When this is converted into the voltage outputted from the CSA 20, 0.128 mV and 16 mV correspond thereto, respectively, when the feedback capacitor 20b is 10 pF. In this case, it is possible to make the operation voltage range of the circuits following the sampling hold circuit S/H be substantially equal to that of the filming mode.

By the way, the quantum noise that has been generated increases a slope of ½ with respect to the signal charge amount. The quantum noise decreases as the dose becomes stronger. In general, the dose used in the filming mode is 300 times as large as that in the fluoroscopy mode. This means that the quantum noise in the filming mode is 1/17 of the quantum noise in the fluoroscopy mode. In other words, it is clear that the quantum noise in the fluoroscopy mode requires much more severe measures therefor than in the filming mode.

The following description deals with the noise generated by the reading circuit 16.

The operational amplifier 20a constituting the CSA (charge sensitive amplifier 20) itself generates the noise power. The main reason thereof is the thermal noise that the circuit element constituting the operational amplifier 20a generates. The thermal noise is come out as the white noise whose frequency range extends to the high frequency. The noise power varies in proportion to the square root of the frequency band of the circuit. Accordingly, it is possible to reduce the output noise by cutting the unnecessary high frequency components. For example, when comparing the case where the frequency band of the circuit system between the CSA and the sampling hold circuit 10MHz with the case of 100 kHz, the noise power of the former case is 10 times as large as the latter case, provided that the other conditions are the same. Accordingly, it is preferable not to unnecessarily broaden the frequency band of the circuit system, i.e., it is preferable to cut the high frequency components that are unnecessary for the operations of the circuit.

It is possible to cut the unnecessary high frequency components by using a low pass filter (LPF). It is possible to get the larger effect by providing the LPF on the upstream side of the circuit as long as the circumstances permit. Accordingly, the LPF may be provided between the CSA and the main amplifier MA like the unit reading circuit shown in FIG. 8.

Figure 9:
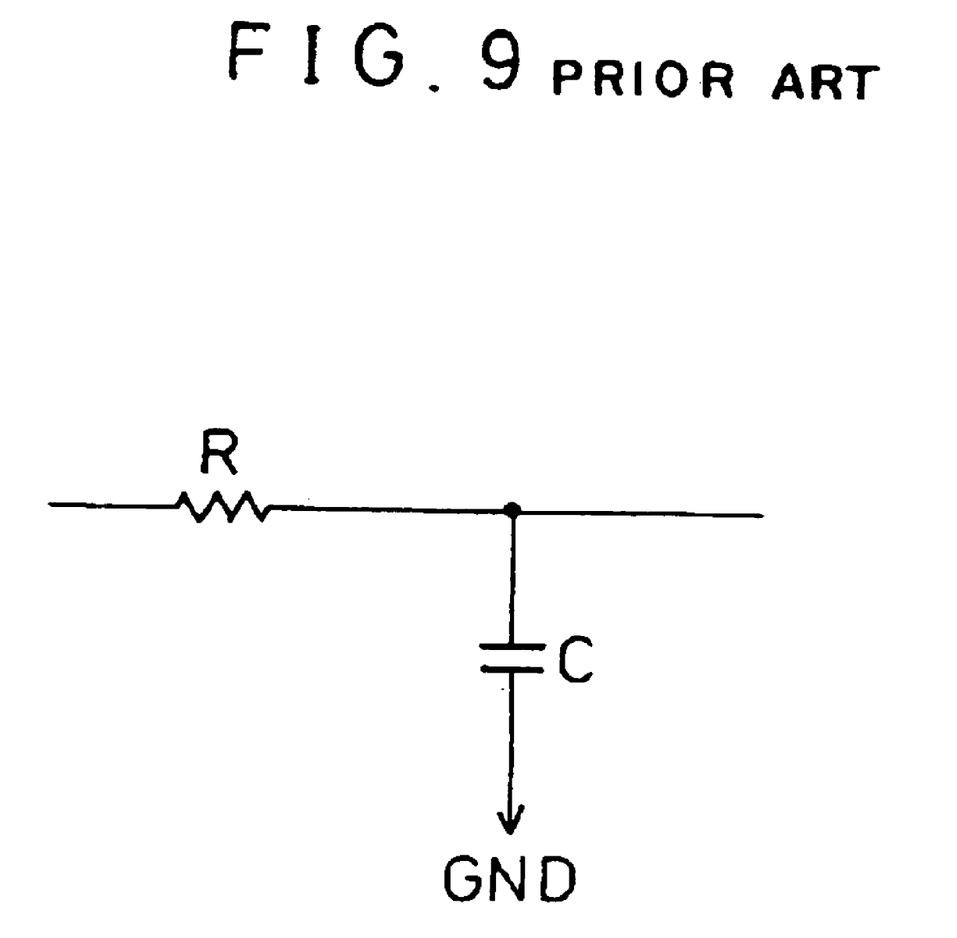
FIG. 9 is a circuit diagram showing a structure of the first order low pass filter circuit.

FIG. 9 shows the first order LPF having the simplest structure. Since the first order LPF is constituted by a resistor R and a capacitor C, the area required for the LPF causes the area of LSI to increase. By the way, in the case of the radiography apparatus, the pixel pitch of the sensor falls within the range between 100 μm and 150 μm, and the number of the data lines and the scanning lines fall within the range between 1,000 and 3,000, respectively. The unit reading circuit shown in FIG. 13 or FIG. 8 should be provided for each data line. Accordingly, the width of the space permitted for each unit reading circuit is also limited to the size not larger than this size. It is not always easy to provide the LPF in such limited space. Even if it is possible to do so, it can not be avoided making the chip size increase, thereby causing the cost to become high, accordingly.

SUMMARY OF THE INVENTION

It is an object of the present invention to provide a charge amount detection circuit and a two-dimensional image sensor using same which suppress the enlargement of the chip size due to the provision of LPF as much as possible so as to suppress the rise of the chip cost as much as possible.

In order to achieve the foregoing object, a charge amount detection circuit in accordance with the present invention in which a charge sensitive amplifier is followed by a low pass filter circuit and the low pass filter circuit is followed by a voltage amplifier circuit, is characterized in that one part of circuit elements constituting the low pass filter circuit and one part of circuit elements constituting the voltage amplifier circuit is commonly used.

With the arrangement, the low pass filter circuit and the voltage amplifier circuit share one part of the circuit elements that constitute the respective circuits. Accordingly, it is possible to reduce the size corresponding to the one part of the circuit elements thus shared, so that the chip size is reduced on the whole. Thus, it is possible to suppress the enlargement of the chip size due to the provision of the low pass filter circuit as much as possible so as to suppress the rise of the chip cost as much as possible.

A two-dimensional image sensor in accordance with the present invention is characterized by having the charge amount detection circuit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. The present invention will become more fully understood from the detailed description given hereinbelow and the accompanying drawings which are given by way of illustration only, and thus, are not limitative of the present invention.

DESCRIPTION OF THE EMBODIMENTS

The following description deals with one embodiment of the present invention with reference to FIGS. 1 through 12.

A charge amount detection circuit in accordance with the present invention is used in an image sensor 48 as a reading circuit (charge amount detection circuit) 16 shown in FIG. 1. The structures of the image sensor 48, the reading circuit 16, and other circuits have already been described with reference to FIGS. 1 through 9. Accordingly, the description thereof is omitted here.

First, the conceptional structure of the present invention is described. According to the reading circuit 16 of the present invention, circuit elements constituting an LPF (low pass filter circuit) and circuit elements constituting a voltage amplifier circuit MA can be commonly used. This allows to reduce the circuit elements constituting the LPF.

Figure 10A:
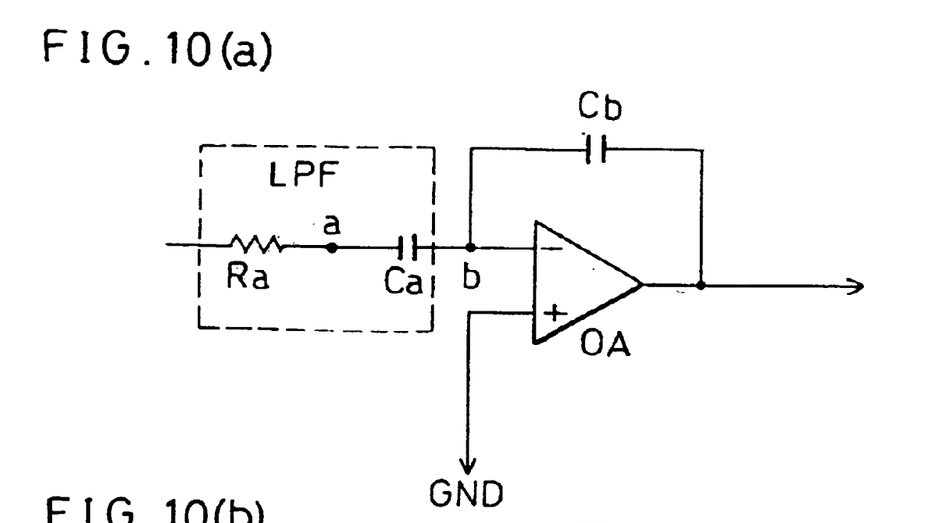
FIG. 10(a) is a circuit diagram showing a structure of the first order low pass filter circuit and the voltage amplifier circuit.
Figure 10B:
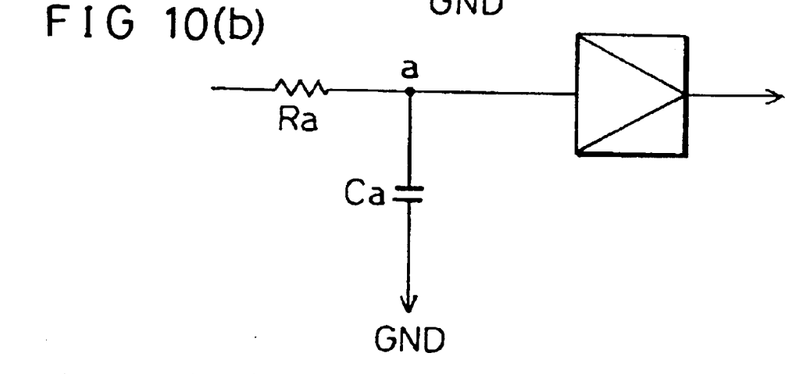
FIG. 10(b) is a circuit diagram showing the structure of FIG. 10(a) in a block diagram manner.
Figure 10C:
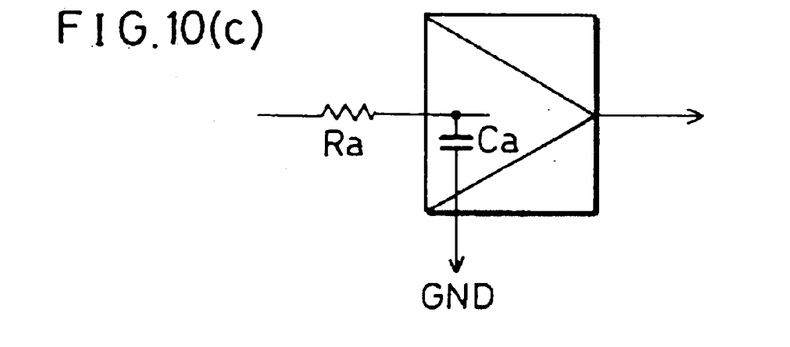
FIG. 10(c) is a circuit diagram showing a strict equivalent circuit of the structure of FIG. 10(a) in a block diagram manner.

FIG. 10(a) is a conceptional diagram. In FIG. 10(a), the LPF is composed of a resistor Ra and a capacitor Ca. The voltage amplifier circuit MA is composed of an operational amplifier OA and capacitors Ca and Cb shown in FIG. 10(a). The capacitors Ca and Cb determine the amplification of the voltage amplifier circuit MA. Namely, the capacitor Ca constitutes the LPF as well as constitutes the voltage amplifier circuit MA. Time constant of the LPF is indicated as (Ra·Ca), and the amplification of the voltage amplifier circuit MA is indicated as (Ca/Cb). Thus, by sharing the capacitor Ca, the circuit element that is increased by providing the LPF is the resistor Ra, only. Note that a non-inverted input terminal of the operational amplifier OA has a GND level based on the concept of imaginary short. Accordingly, the voltage of an inverted input terminal (the voltage of point b of FIG. 10(a)) has also the GND level. The operational amplifier OA amplifies a voltage of a connecting point (point a of FIG. 10(a)) of the resistor Ra and the capacitor Ca by −(Ca/Cb) times. FIG. 10(b) is a circuit diagram showing the structure of FIG. 10(a) in a block diagram manner. Note that FIG. 10(c) is a circuit diagram showing a strict equivalent circuit of the structure of FIG. 10(a), since the capacitor Ca is shared by the LPF and the voltage amplifier circuit MA. In the circuit having the structure of FIG. 10(a), the resistor Ra and the capacitor Ca are connected in series between the input section and the GND level. The resistor Ra and the capacitor Ca constitute the structure that is equivalent to that of the LPF shown in FIG. 9.

Figure 11:
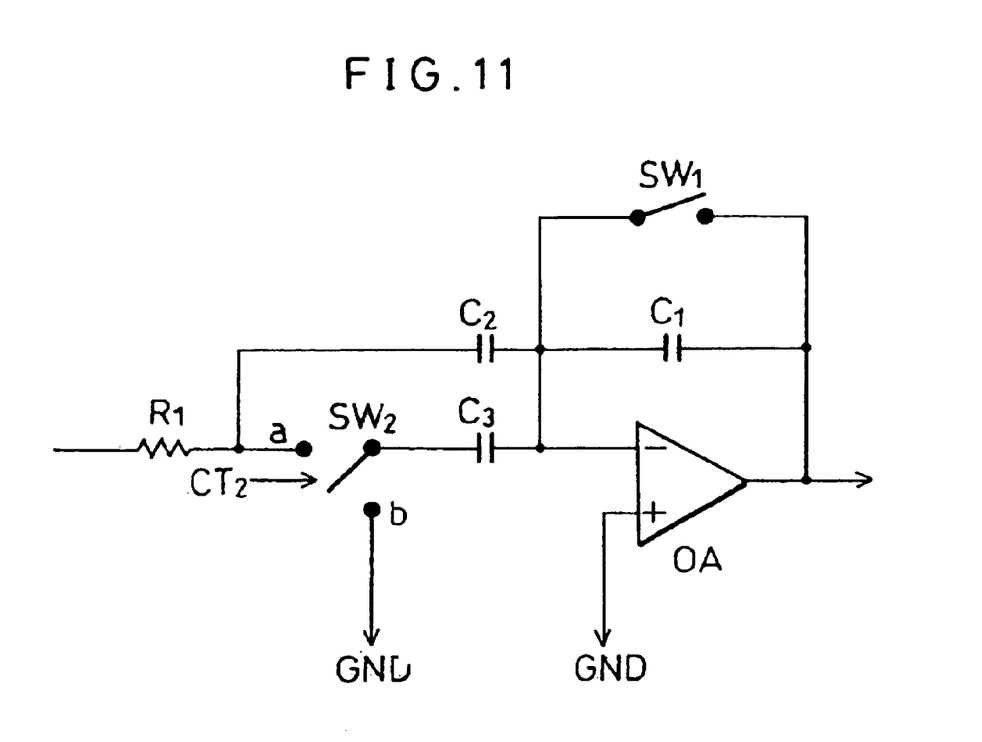
FIG. 11 is another circuit diagram showing a structure of the first order low pass filter circuit and the voltage amplifier circuit.

The following description deals with a more concrete structure. More specifically, FIG. 11 shows an example of such a structure. In FIG. 11, an LPF is composed of a resistor $R_1$, and capacitors $C_2$ and $C_3$. A voltage amplifier circuit MA is composed of an operational amplifier OA, a capacitor $C_1$, and the capacitors $C_2$ and $C_3$. As shown in FIG. 11, according to this circuit, it is possible to switch between a state in which the capacitor $C_3$ is inserted and a state in which the capacitor $C_3$ is not inserted. The switching is carried out in accordance with a control signal $CT_2$ of the switch $SW_2$. More specifically, the controlling of the switch is carried out in accordance with the control signal outputted from a control circuit. For example, in FIG. 11, when the control signal $CT_2$ is a high level, the switch $SW_2$ is connected to the terminal a side, while is connected to the terminal b side when the control signal $CT_2$ is a low level, thereby controlling whether or not the capacitor $C_3$ is inserted to the circuit. More specifically, for example, the controlling can be made by setting the control signal $CT_2$ to a high level in the fluoroscopy mode (dynamic picture) while a low level in the filming mode (static picture). The capacitor $C_2$ has the same capacitance as the capacitor $C_1$, and is always provided in the circuit. The switch $SW_1$ is provided for discharging the charges stored in the capacitor $C_1$ so as to initialize the circuit. The switch $SW_1$ is switched off while the circuit is in operation. Since the switch $SW_1$ is not directly related to the subject matter of the present invention, hereinafter, the explanation thereof is omitted.

When the control signal $CT_2$ is a low level, the switch $SW_2$ is connected to the terminal b side. The time constant of the LPF is indicated as $(C_2·R_1)$, and the amplification of the voltage amplifier circuit MA is indicated as $(C_2/C_1)$. Here, when it is assumed that the capacitor $C_2$ has the same capacitance as the capacitor $C_1$ (i.e., $C_2=C_1$), the amplification of the voltage amplifier circuit MA becomes 1.

In contrast, When the control signal $CT_2$ is a high level, the switch $SW_2$ is connected to the terminal a side. The capacitors $C_2$ and $C_3$ are connected in parallel with each other. The time constant of the LPF is indicated as $((C_2+C_3)·R_1)$, and the amplification of the voltage amplifier circuit MA is indicated as $((C_2+C_3)/C_1)$.

Thus, when the amplification by the voltage amplifier circuit MA is required because the signal level is small, the time constant becomes greater. As a result, the output noise becomes reduced and the necessary voltage amplification can be obtained. In the filming mode, the LPF having the amplification of 1 is used. As was previously described, since the signal charge amount during the filming mode is tens times greater than that during the fluoroscopy mode, it is possible to obtain a full S/N (signal to noise ratio) under some conditions (it depends on conditions), even when the effect of the LPF is small. In order to detect the signal even in the fluoroscopy mode, it is necessary for the operational amplifier OA to have fully small noise characteristics by nature. As long as the operational amplifier having such small noise characteristics is used, the noise amount becomes fully smaller than the signal charge amount even in the case where no LPF is provided or the effect of the LPF is small. When the time constant of the LPF is greater than is needed, the S/N deteriorates conversely as has been previously described.

Figure 12:
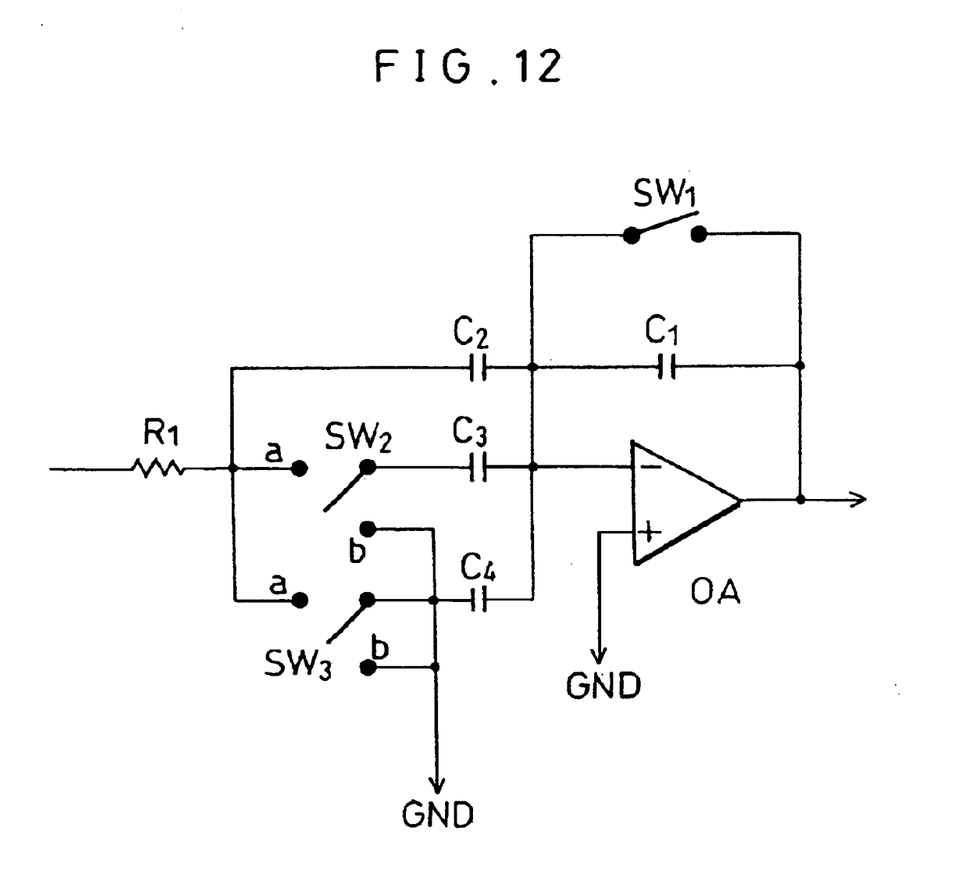
FIG. 12 is a further circuit diagram showing a structure of the first order low pass filter circuit and the voltage amplifier circuit.

FIG. 12 shows another example of the circuit configuration. An LPF is composed of a resistor $R_1$, and capacitors $C_2$, $C_3$, and $C_4$. A voltage amplifier circuit MA is composed of an operational amplifier OA, and capacitors $C_1$, $C_2$, $C_3$, and $C_4$. As shown in FIG. 12, according to this circuit, it is possible to switch the amplifications of the voltage amplifier circuit MA in a multiple-stage manner. When the switches $SW_2$ and $SW_3$ are connected to the respective terminal a sides, the amplification of the voltage amplifier circuit MA is indicated as $((C_2+C_3+C_4)/C_1)$. The time constant of the LPF is indicated as $((C_2+C_3+C_4)·R_1)$. Note that when the $SW_2$ is solely connected to the terminal a side, the amplification of the voltage amplifier circuit MA is indicated as $((C_2+C_3)/C_1)$. The time constant of the LPF is indicated as $((C_2+C_3)·R_1)$. Note also that when the $SW_3$ is solely connected to the terminal a side, the amplification of the voltage amplifier circuit MA is indicated as $((C_2+C_4)/C_1)$. The time constant of the LPF is indicated as $((C_2+C_4)·R_1)$. Further, when the switches $SW_2$ and $SW_3$ are connected to the respective terminal b sides, the amplification of the voltage amplifier circuit MA is indicated as $(C_2/C_1)$. The time constant of the LPF is indicated as $(C_2·R_1)$.

Thus, in the above-mentioned circuit, the amplifications are switched between $(C_2/C_1)$, $((C_2+C_3)/C_1)$, $((C_2+C_4)/C_1)$, and $((C_2+C_3+C_4)/C_1)$. In accordance with the amplifications, the respective time constants are switched to $(C_2·R_1)$, $((C_2+C_3)·R_1)$, $((C_2+C_4)·R_1)$, and $((C_2+C_3+C_4)·R_1)$. When the amplification should be great, the signal charge amount is small and its time constant becomes great. Thus, it is possible that the noise amount is smaller as the signal amount is smaller. Note that it is possible to obtain the amplification of 1 like the circuit of FIG. 11 as in the filming mode by satisfying the equation $C_2=C_1$.

Note in the present invention that a charge amount detection circuit may be arranged so that a charge sensitive amplifier is followed by a low pass filter circuit and the low pass filter circuit is followed by a voltage amplifier circuit, in which one part of circuit elements constituting the low pass filter circuit and one part of circuit elements constituting the voltage amplifier circuit are commonly used.

In the charge amount detection circuit, the low pass filter circuit may be the first order filter circuit and the circuit element thus shared may be a capacitor.

In the charge amount detection circuit, the low pass filter circuit may be the first order filter circuit and the circuit element thus shared may be a resistor.

In the charge amount detection circuit, the amplification of the voltage amplifier circuit may be controlled in accordance with a control signal that is externally applied, and the time constant of the low pass filter circuit varies in accordance with the amplification thus controlled.

In the charge amount detection circuit, a resistor (resistor $R_1$ shown in FIG. 12) and a capacitor (capacitor $C_2$ shown in FIG. 12) may be connected in series between (a) a charge sensitive amplifier and (b) an inverted input terminal of the operational amplifier constituting the voltage amplifier circuit that follows the charge sensitive amplifier, and at least one capacitors (capacitors $C_3$ and $C_4$) may be further connected with the inverted input terminal while the other electrodes of the capacitors are connected in parallel with the capacitor ($C_2$) through a switch.

In the charge amount detection circuit, when the capacitors $C_3$ and $C_4$ are not connected in parallel with each other, the electrodes on the switch side may be connected in an LSI so as to have a same voltage as that of a non-inverted input terminal of the operational amplifier that follows the switch.

In the charge amount detection circuit, the capacitor $C_2$ may have the same capacitance as the capacitor $C_1$.

The primary effect of the present invention lies in that the LPF is easily provided in a signal reading LSI so that it is easily possible to realize a signal reading LSI with low noise. The secondary effect of the present invention lies in that the enlargement of the chip size due to the provision of LPF so as to suppress the rise of the chip cost.

According to the present invention, when a signal charge amount of the data is small like the case of the dynamic picture and the amplification should be great, it is possible to reduce the noise amount by increasing the time constant of the LPF. In contrast, when the signal charge amount of the data is fully great like the case of the static picture and the amplification may be small, it is possible to maintain a suitable S/N by reducing the time constant of the LPF. Therefore, it is possible to carry out the signal charge detection with high precision in which the noise amount is very small and S/N maintains good irrespective of picture conditions.

When the time constant of the LPF is large, it is likely that the voltage does not fully reach the steady state at some timings for sampling the output of the voltage amplifier circuit by the sampling hold circuit. When fully prolonging the time required until the sampling is carried out, the voltage can reach the steady state. However, this causes the deficiency that it takes longer to read the data, accordingly. When it takes longer to read the data, the loss ratio of the signal voltage due to such as the leak current increases, thereby causing to lower S/N. According to the present invention, the time constant of the LPF is not needed to increase unnecessarily. The present invention has the unique effect on this point.

In addition to the arrangement, the charge amount detection circuit of the present invention may have the structure that the time constant of the low pass filter circuit increases as the amplification of the voltage amplifier circuit increases.

In general, the low pass filter circuit has a direct and great effect that the noise amount is reduced, but has a side effect that the voltage to be detected contains an error. Especially, in the first order filter circuit that is composed of a resistor and a capacitor, there are history characteristics with respect to a pulse input, thereby causing the time constants of the respective pulse inputs to delicately change. The degrees of such changes vary depending especially on the structure of the capacitor, i.e., are not flat. However, it is true that the changes become larger as the time constant becomes larger. One example is described here. In the case where a capacitor of double polysilicon structure and a resistor of C-MOS structure are used, the change of ±1 percent or more with respect to a central value of 8 $\mu$s can be sometimes observed. This kind of change in the charge amount detection circuit affects the attenuation ratio of the signal voltage, thereby causing that the voltage to be detected has an error, i.e., a noise. Namely, the low pass filter circuit can reduce the noise from view point of the frequency band as the time constant is larger, but has the side effect that the noise due to the above-mentioned structure increases conversely.

In the fluoroscopy mode in which the dynamic picture is taken, the signal to noise ratio S/N is small by nature. Accordingly, the rising of the S/N due to the noise suppressing effect of the low pass filter circuit overwhelmingly prevails.

In contrast, in the case where the S/N is by nature much larger than the fluoroscopy mode like the filming mode in which the static picture are taken, the deterioration in S/N due to the noise generated by the above-mentioned structure becomes larger than the improvement of the S/N due to the low pass filter circuit for some time constants. In order to overcome the deficiency, it is necessary to take means not to unnecessarily increase the time constant of the low pass filter circuit in the filming mode while it is necessary to fully increase the time constant in the fluoroscopy mode.

With the arrangement, the time constant of the low pass filter circuit increases as the amplification of the voltage amplifier circuit increases. When the amplification should be great because a signal charge amount of the data is small as in the case of the dynamic picture, it is possible to reduce the noise amount by increasing the time constant of the low pass filter circuit. In contrast, when the amplification may be small because the signal charge amount of the data is fully great as in the case of the static picture, it is possible to maintain a suitable S/N by reducing the time constant of the low pass filter circuit. Therefore, in addition to the foregoing effects, it is possible to carry out the signal charge detection with high precision in which the noise amount is very small and S/N maintains good irrespective of picture conditions.

The charge amount detection circuit of the present invention may be further provided with a sampling hold circuit S/H for sampling and holding the signal amount that has been detected, an A/D (analog to digital) converter ADC for converting the signal charge to an analog digital signal AD, a multiplexer for assigning a plurality of input terminals to the single analog to the digital converter ADC, and a data latch circuit DL for holding the signal charge that has been converted into a digital value.

There are described above novel features which the skilled man will appreciate give rise to advantages. These are each independent aspects of the invention to be covered by the present application, irrespective of whether or not they are included within the scope of the following claims.

What is claimed is:

1. A charge amount detection circuit, comprising:

a charge sensitive amplifier;

a low pass filter circuit provided so as to follow the charge sensitive amplifier; and a voltage amplifier circuit provided so as to follow the low pass filter circuit, wherein one part of circuit elements constituting the low pass filter circuit and one part of circuit elements constituting the voltage amplifier circuit are commonly used;

wherein the low pass filter circuit and the voltage amplifier circuit share a plurality of capacitors that are connected with each other in parallel; and a switch for switching between a state in which at least one of die capacitors are inserted in the charge amount detection circuit and a state in which said at least one of the capacitors are not inserted.

2. The charge amount detection circuit as set forth in claim 1, wherein a time constant of the low pass filter circuit increases as an amplification of the voltage amplifier circuit increases.

3. The charge amount detection circuit as set forth in claim 1, wherein the voltage amplifier circuit includes an operational amplifier having an inverted input terminal to which the capacitor is connected; and the low pass filter circuit includes a resistor and the plurality of capacitors are connected in series with the resistor.

4. The charge amount detection circuit as set forth in claim 1, wherein an amplification of the voltage amplifier circuit is 1 when the state in which said at least one of the capacitors are not inserted in made by the switch.

5. The charge amount detection circuit as set forth in claim 1, wherein a plurality of switches for respective switching between a state in which at least one of the capacitors are inserted in the charge amount detection circuit and a state in which said at least one of the capacitors are not inserted, numbers of the capacitors that are switched by the respective switches being different from each other.

6. The charge amount detection circuit as set forth in claim 1, wherein the voltage amplifier circuit includes an operational amplifier, having an inverted input terminal and an output terminal, in which a feedback capacitor is provided between the inverted input terminal and the output terminal.

7. The charge amount detection circuit as set forth in claim 6, further comprising a reset switch for discharging charges stored in the feedback capacitor so as to reset the voltage amplifier circuit.

8. The charge amount detection circuit as set forth in claim 1, further comprising:

a sampling hold circuit for holding a signal charge outputted from the voltage amplifier circuit;

an analog to digital convener for analog to digital converting the signal charge that has held by the sampling hold circuit;

a multiplexer for assigning a plurality of input terminals to the analog to digital converter; and a data latch circuit for holding the signal charge that has been converted into a digital value.

9. A two-dimensional image sensor having a charge amount detection circuit, said circuit comprising:

a charge sensitive amplifier;

a low pass filter circuit provided so as to follow the charge sensitive amplifier; and a voltage amplifier circuit provided so as to follow the low pass filter circuit, wherein one part of circuit elements constituting the low pass filter circuit and one part of circuit elements constituting the voltage amplifier circuit are commonly used;

wherein the low pass filter circuit and the voltage amplifier circuit share a plurality of capacitors that are connected with each other in parallel; and a switch for switching between a state in which at least one of the capacitors are inserted in the charge amount detection circuit and a state in which said at least one of the capacitors are not inserted.

10. The two-dimensional image sensor as set forth in claim 9, further comprising a photoelectric conversion section that converts photons into charges and stores the charges, wherein the charge amount detection circuit reads the charges from the photoelectric conversion section.

11. The two-dimensional image sensor as set forth in claim 10, wherein the photoelectric conversion section includes pixel electrodes for holding the charges to which the photons have been converted.

12. The two-dimensional image sensor as set forth in claim 11, further comprising:

data lines that send the charges held by the pixel electrodes to the charge amount detection circuit; and switching devices that connect the pixel electrodes with the data lines, respectively, wherein the pixel electrodes flow the charges that have been held to the data lines when the switching devices turn on.

13. The two-dimensional image sensor as set forth in claim 12, further comprising scanning lines that supply voltages for controlling the respective switching elements.

* * * * *